United States Patent [19]
Miyake

[11] Patent Number: 5,403,766
[45] Date of Patent: Apr. 4, 1995

[54] METHOD FOR FABRICATING A SEMICONDUCTOR MEMORY DEVICE HAVING STACKED CAPACITORS

[75] Inventor: Hideharu Miyake, Tokyo, Japan

[73] Assignee: NEC Corporation, Tokyo, Japan

[21] Appl. No.: 277,015

[22] Filed: Jul. 19, 1994

Related U.S. Application Data

[62] Division of Ser. No. 176,467, Jan. 3, 1994.

[30] Foreign Application Priority Data

Jan. 4, 1993 [JP] Japan ................................. 5-14397

[51] Int. Cl.⁶ ...................... H01L 21/70; H01L 27/00
[52] U.S. Cl. ...................... 437/52; 437/60; 437/919
[58] Field of Search ............... 437/47, 52, 60, 919; 257/304-308, 311

[56] References Cited

U.S. PATENT DOCUMENTS 5,235,199  8/1993  Hamamoto et al. ............... 257/306
5,236,859  8/1993  Bae et al. ............................ 437/52
5,326,714  7/1994  Liu et al. ............................ 437/60

Primary Examiner—Olik Chaudhuri
Assistant Examiner—H. Jey Tsai
Attorney, Agent, or Firm—Young & Thompson

[57] ABSTRACT

A semiconductor memory device having stacked-capacitor type memory cells, each of which contains an MOS transistor and a storage capacitor. The capacitor has a first opposed electrode having a recess at its upper face, which is formed through an inter-layer insulation film on the substrate, a first insulation film which covers a surface of the first opposed electrode, a charge storage electrode formed in the recess of the first opposed electrode and contacted with the source region of the transistor through a contact hole of the inter-layer insulation film, a second insulation film which covers a surface of the charge storage electrode, and a second opposed electrode formed on the second insulation film. The charge storage electrodes do not broken in the fabrication sequence of the device. Even if the charge storage electrodes are sheered off in positioning to the corresponding contact holes, the inter-layer insulation film is disadvantageously etched.

2 Claims, 10 Drawing Sheets 5,403,766

METHOD FOR FABRICATING A SEMICONDUCTOR MEMORY DEVICE HAVING STACKED CAPACITORS

This application is a division of application Ser. No. 08/176,467, filed Jan. 3, 1994.

BACKGROUND OF THE INVENTION

1. Field of the Invention

The present invention relates to a semiconductor memory device and more particularly, to a semiconductor memory device such as a Dynamic Random Access Memory (DRAM) provided with stacked capacitor-type memory cells and its fabrication method.

2. Description of the Related Art

Stacked capacitor-type DRAMs effective in increasing capacitance of a storage capacitor per unit cell area have so far been proposed, in which each memory cell is provided with an MOS transistor as a transfer gate and a stacked capacitor for charge storage. An example of such DRAMs is an FIN-structured stacked capacitor-type DRAM cell disclosed in the Japanese Examined Patent Publication No. 3-20905.

FIG. 1A through FIG. 1C are cross sections vertical to word lines of the FIN-structured stacked capacitor-type cell and FIG. 2A through FIG. 2C are cross sections vertical to bit lines of the same, each of which shows a fabrication sequence of the cell.

In FIGS. 1C and 2C, a field oxide film 22 for device isolation is formed on the surface of a P-type silicon substrate 21. In each of active areas surrounded by the field oxide film 22 an MOS transistor is formed. Each of the MOS transistors is composed of an N-type diffusion layer 25s forming a source region, an N-type diffusion layer 25d forming a drain region and a gate electrode 24g formed on a gate oxide film 23.

As seen from FIGS. 1C and 2C, the N-type diffusion layers 25 forming the source region are provided for the respective transistors and each of the N-type diffusion layers 25d forming the drain regions is provided for the two transistors adjacent to each other. The gate electrodes 24g are respectively connected to corresponding word lines 24w formed on the field oxide film 22. The gate electrodes 24g and the word lines 24w are both made of polysilicon.

The surfaces of the active areas, the gate electrodes 24g and the word lines 24w and the uncovered surface of the field oxide film 22 are covered with a first inter-layer insulation film. On the surface of the first inter-layer insulation film 26 bit lines 35 made of tungsten silicide are formed. A second inter-layer insulation film 27 is formed on the surfaces of the bit lines 35 and the uncovered surface of the first inter-layer insulation film 26.

A silicone nitride film 39 is formed on the second inter-layer insulation film 27 and on the film 39 an opposed electrode 28 of the storage capacitor is formed. Charge storage electrodes 31 of the capacitors, each of which has a cross section like a "T" character, are formed to be buried in the opposed electrode 28. The entire surfaces of the charge storage electrodes 31 buried in the opposed electrode 28 are covered with insulation films 29, respectively.

Bottom ends of the charge storage electrodes 31 are in contact with the surfaces of the corresponding N-type diffusion layers 25s as the source regions through corresponding contact holes 38. The holes 38 are formed through the silicon nitride film 39, the second inter-layer insulation film 27 and the first inter-layer insulation film 26, respectively. Thus, the T-shaped charge storage electrodes 31 are electrically connected to the N-type diffusion layer 25s as the source regions, respectively.

Each of the opposed electrodes 28, the insulation films 29 and the charge storage electrodes 31 constitutes each of the storage capacitors. These capacitors are provided on the second inter-layer insulation film 27, in other words, they are stacked over the MOS transistors.

The DRAM memory cells having the above structure are fabricated through the following sequence:

First, as shown in FIGS. 1A and 2A, the field oxide film 22 of about 500 nm in thickness is selectively formed on the surface of the P-type semiconductor substrate 21 using a conventional selective oxidation technique so that the active regions are formed on the surface of the substrate 21. The active regions of the substrate 21 are then ion-implanted for controlling the threshold voltage of the MOS transistors.

The gate oxide films of about 15 nm in thickness are grown on the respective active regions and then, a polysilicon film of about 250 nm in thickness is grown all over the substrate 21. Phosphorus (P) is diffused into the polysilicon film to reduce its sheet electric resistance to a desired level and then, the polysilicon film is etched to a desired pattern using a photolithography technique. Thus, the gate electrodes 24g and the word lines 24w are obtained.

Next, with the field oxide film 22 and the gate electrodes 24g as a mask, phosphorus (P) ions are implanted into the substrate 21 with a dose of about $10^{13}$ cm$^{-2}$ and the substrate 21 is heat-treated. This results in the N-type diffusion layers 25s and 25d to function as the source and drain regions.

A silicon oxide film and a BPSG film containing as impurities boron (B) and phosphorus (P) are successively formed over the surface of the substrate 21 using a Chemical Vapor Deposition (CVD) technique to form the first inter-layer insulation film 26 of about 350 nm in thickness.

Using a photolithography technique, a wiring layer (not shown) is formed on the first inter-layer insulation film 26 to make contacts for the bit lines 35, and contact holes (not shown) for connecting the diffusion layers 25s and 25d and the gate electrodes 24g are formed in the insulation film 26. A tungsten silicide film of about 150 nm in thickness is formed on the first inter-layer insulation film 26 by a sputtering technique and patterned the tungsten silicide film by a photolithography technique. Thus, the bit lines 35 made of tungsten silicide are obtained.

A BPSG film of about 400 nm in thickness is formed on the entirety of the first inter-layer insulation film 26 and is reflowed to be flattened, resulting in the second inter-layer insulation film 27. A silicone nitride film 39 of about 20 nm in thickness is grown on the entirety of the second inter-layer insulation film 27 and then, a silicon oxide film 36 of about 100 nm in thickness is grown on the entirety of the silicon nitride film 39.

Using a photolithography technique, the silicone oxide film 36, the silicone nitride film 39, the second inter-layer insulation film 27 and the first inter-layer insulation film 26 are selectively etched to form the contact holes 38 which extend to the surfaces of the corresponding N-type diffusion layers 35s. The cross sections of the device at this time are shown in FIGS. 1A and 2A.

Subsequently, the polysilicon film of about 300 nm in thickness is grown on the entirety of the silicon oxide film 36. Phosphorus is diffused into the polysilicon film 36 to reduce its sheet electric resistance to a desired level and then the polysilicon film 36 is patterned to obtain the charge storage electrodes 31. The silicon oxide film 36 is then removed by etching using buffered hydrogen fluoride. The charge storage electrodes 31 have each T-shaped cross sections. The state at this time is shown in FIGS. 1B and 2B.

Next, as shown in FIGS. 1C and 2C, a silicon nitride film of about 70 nm in thickness is grown and the surface thereof is oxidized in a steaming atmosphere to form the insulation films 29 of the storage capacitors. The insulation films 29 respectively cover the entire surfaces of the charge storage electrodes 31, which are projecting from the silicon nitride film 39.

A polysilicon film of about 150 nm in thickness is grown on the silicon nitride film 39 and its sheet electric resistance is reduced to a desired level by phosphorus diffusion. The polysilicon film is then patterned to form the opposed electrode 28 of the capacitors. The charge storage electrodes 31 are buried in the opposed electrode 28.

Subsequently, although illustration is omitted, a third inter-layer insulation film is formed on the entire surface of the opposed electrode 28. Contact holes are formed in the third inter-layer insulation film and then, a metallic wiring layer is formed thereon. As a result, the opposed electrode 28 is electrically connected to the metallic wiring layer through the contact holes.

Thus, the stacked capacitor-type DRAM cells with the FIN-structure are obtained.

In the conventional stacked capacitor-type DRAM cells, not only the top or upper faces of the charge storage electrodes 31 but also the bottom or lower faces thereof can serve as capacitors. Therefore, the area of the charge storage electrodes 31 can be expanded by using an upper area over the bit lines 35 and as a result, the capacitance value per unit cell area of the conventional stacked capacitor-type DRAM cells with the FIN-structure can be enlarged about 1.5 times as much as those of conventional stacked capacitor-type DRAM cells without the FIN-structure.

The conventional FIN-structured stacked capacitor-type DRAM cells, however, have a problem that the upper wing-like parts of the charge storage electrodes 31 are easily broken due to mechanical shocks occurring in centrifugal drying, vacuum drawing or the like during the fabrication process shown in FIGS. 1B and 2B since the charge storage electrodes 31 are supported by only their pillar parts buried in the corresponding contact holes 38.

In addition, the conventional DRAM cells have another problem that when the charge storage electrodes 31 are sheered off in centering to the corresponding contact holes 38 during the process shown in FIGS. 1B and 2B, the top parts of the electrodes 31 are formed into undesired shapes as well as the second inter-layer insulation film 27 is partially etched as shown in FIG. 3. In FIG. 3, charge storage electrodes 31a whose top parts are not of T-shape cross sections are illustrated.

Further, they have still another problem that the silicon nitride film 39 and the silicon oxide film 36 are staked with each other during the fabrication process shown in FIGS. 1A and 2A, so that the silicon nitride film 39 may project during the process of forming the contact holes 38 or that of pre-treatment for the metallic wiring layer formed on the third inter-layer insulation film by sputtering, which adversely affecting coverage of the metallic wiring layer.

SUMMARY OF THE INVENTION

Accordingly, an object of the present invention is to provide a semiconductor memory device and its fabrication method in which charge storage electrodes of storage capacitors can be formed without suffering such a damage as described above in its fabrication sequence.

Another object of the present invention is to provide a semiconductor memory device and its fabrication method in which even if charge storage electrodes of the storage capacitors are sheered off in centering to corresponding contact holes for contacting corresponding source regions of MOS transistors during the fabrication sequence, the shapes of the charge storage electrodes can be made into desired ones and there is no possibility that an inter-layer insulation film which buries the lower parts of the electrodes is partially etched.

A still another object of the present invention is to provide a semiconductor memory device and its fabrication method in which coverage of a metallic wiring film is more difficult to be deteriorated when the metallic wiring layer is formed through an inter-layer insulation film over the charge storage electrodes.

In a first aspect of the present invention, a semiconductor memory device having stacked-capacitor type memory cells is provided, in which each of the memory cells comprises an MOS transistor and a storage capacitor.

The transistor has a source region and a drain region formed in a semiconductor substrate and a gate electrode formed through a gate insulator on the substrate.

The capacitor has a first opposed electrode having a recess at its upper face, which is formed through an inter-layer insulation film on the substrate; a first insulation film which covers a surface of the first opposed electrode; a charge storage electrode formed in the recess of the first opposed electrode and contacted with the source region of the transistor through a contact hole of the inter-layer insulation film; a second insulation film which covers a surface of the charge storage electrode; and a second opposed electrode formed on the second insulation film.

With the semiconductor memory device having the stacked-capacitor type memory cells according to the present invention, the first opposed electrode of the storage capacitor, which is formed through the inter-layer insulation film on the semiconductor substrate, is provided with the recess on its upper face, and the charge storage electrode is formed in the recess through the first insulation film. The second opposed electrode is provided on the charge storage electrode through the second insulation film. As a result, the storage capacitor can be large in capacitance with a small cell size similar to the conventional one with FIN-structure.

In a preferred embodiment, the MOS transistors of the memory cells are arranged in a matrix pattern, and the recesses of the first opposed electrodes are formed to rectangular planar shapes and are arranged in a matrix pattern corresponding to that of the MOS transistors.

In another preferred embodiment, the first insulation film of the capacitor is composed of a silicon nitride film and a silicon oxide film. The silicon oxide film covers a side face of the first opposed electrode which faces the contact hole. The silicon nitride film covers the other surfaces thereof than the side face.

In still another preferred embodiment, the first insulation film of the capacitor is composed of a silicon nitride film and a silicon oxide film. The silicon oxide film covers a side face of the first opposed electrode which faces the contact hole and a side face of the inter-layer insulation film which faces the contact hole. The silicon nitride film covers the other surfaces of the first opposed electrode and the inter-layer insulation film than the side faces thereof.

In a second aspect of the present invention, a fabrication method of the semiconductor memory device of the first aspect is provided.

The transistor has a source region and a drain region formed in a semiconductor substrate and a gate electrode.

The fabrication method comprises the steps of forming source regions and drain regions of MOS transistors of memory cells in a semiconductor substrate; forming gate electrodes of the transistors through corresponding gate insulators on the substrate; forming a inter-layer insulation film so as to cover the source and drain regions and the gate electrodes; forming a first opposed electrode for the storage capacitors, the first opposed electrode having recesses on its upper face on the inter-layer insulation film; forming a first insulation film for the capacitor to cover a surface of the first opposed electrode; forming contact holes extending to the corresponding source regions in the inter-layer insulation film; forming charge storage electrodes in the respective recesses of the first opposed electrode to be in contact with the corresponding source regions through the corresponding contact holes; forming a second insulation film for the capacitors to cover surfaces of the respective charge storage electrodes; and forming a second opposed electrode for the capacitors on the second insulation film.

With the fabrication method of the semiconductor memory device having the stacked-capacitor type memory cells according to the present invention, after the recesses of the first opposed electrode are formed on the upper face thereof, the contact holes and the first insulation film are formed and then, the charge storage electrodes are formed in the respective recesses through the first insulation film. Subsequently, surfaces of the charge storage electrodes are covered with the second insulation film and then, the second opposed electrode is formed. As a result, there is no chance that the charge storage electrodes are supported in unstable states, so that there is no possibility that the charge storage electrodes are broken in the fabrication sequence of the semiconductor memory device.

The inter-layer insulation film is covered with the first opposed electrode and the contact holes are formed in the inter-layer insulation film to pass through the first opposed electrode, so that even if the charge storage electrodes of the storage capacitors are sheered off in centering to the corresponding contact holes during the fabrication sequence, there is no possibility that the inter-layer insulation film is disadvantageously etched. Besides, since the charge storage electrodes are provided in the respective recesses of the first opposing electrode, the shapes of the charge storage electrodes can be made into desired ones.

In addition, with the method of the present invention, no stacked structure of a silicon nitride film and a silicon oxide film is provided during the fabrication sequence similar to that of the conventional one, so that there is no possibility that coverage of a metallic wiring layer formed over the storage capacitors through another inter-layer insulation film is adversely affected due to projection of the silicon nitride film during the process of forming the contact holes and/or that of pre-treatment for the metallic wiring layer.

DESCRIPTION OF THE PREFERRED EMBODIMENTS

Preferred embodiments of the present invention will be described below with reference to the drawings.

[First Embodiment]

Figure 4A:
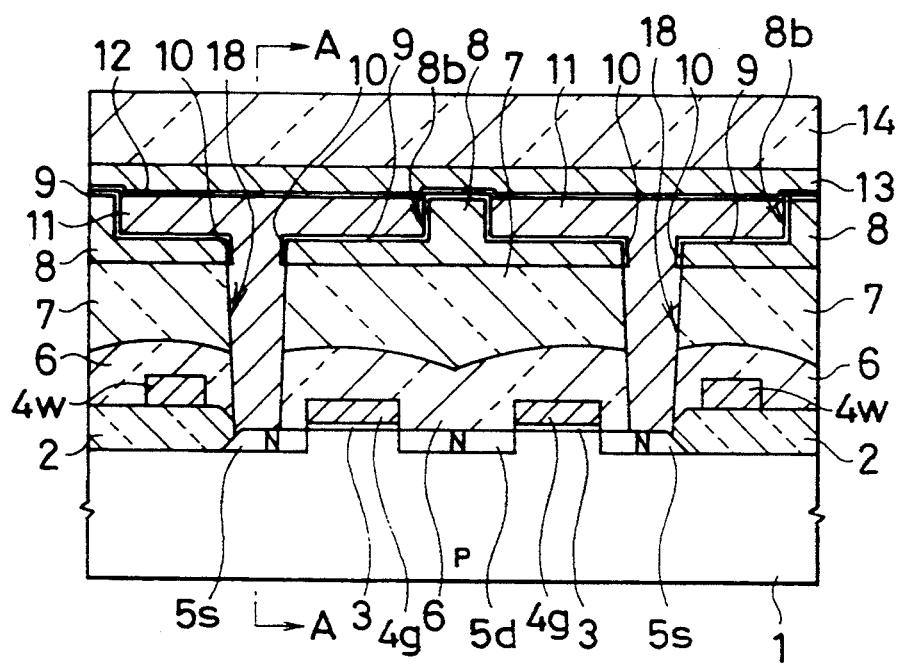
FIG. 4A is a partial cross-sectional view vertical to word lines showing a semiconductor memory device according to a first embodiment of the present invention.
Figure 4B:
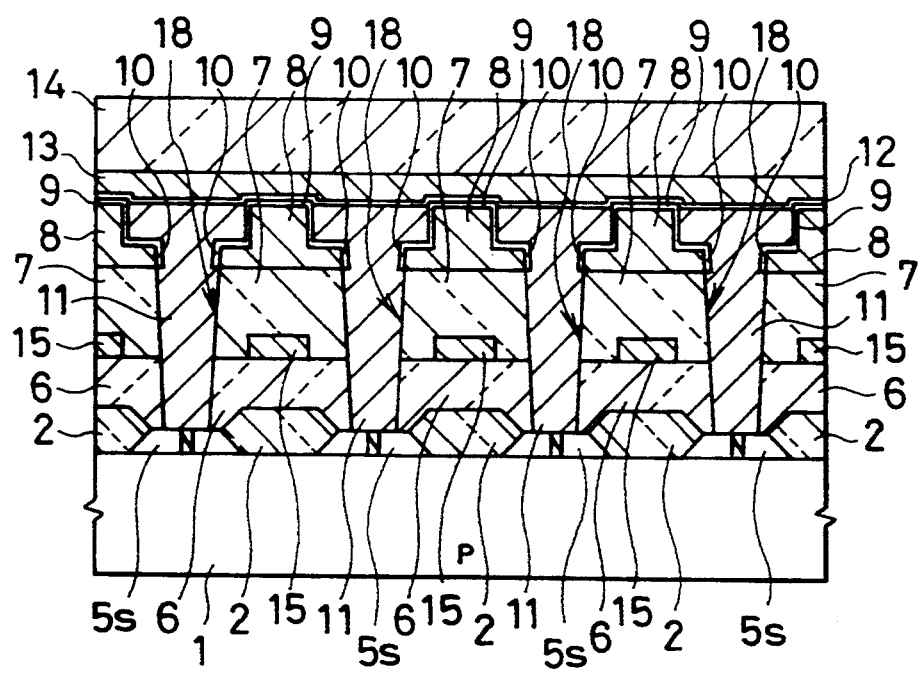
FIG. 4B is a partial cross-sectional view along the line A—A of FIG. 4A.

FIGS. 4A and 4B partially show memory cells of a DRAM according to a first embodiment. Each of the memory cells is provided with an MOS transistor as a transfer gate and a stacked capacitor for charge storage.

In FIGS. 4A and 4B, a field oxide film 2 for device isolation is formed on the surface of a P-type silicone substrate 1. In each of active areas surrounded by the field oxide film 2 an MOS transistor is formed. Each of the MOS transistors is composed of an N-type diffusion layer 5s forming a source region, an N-type diffusion layer 5d forming a drain region and a gate electrode 4g formed on a gate oxide film 3.

Figure 1A:
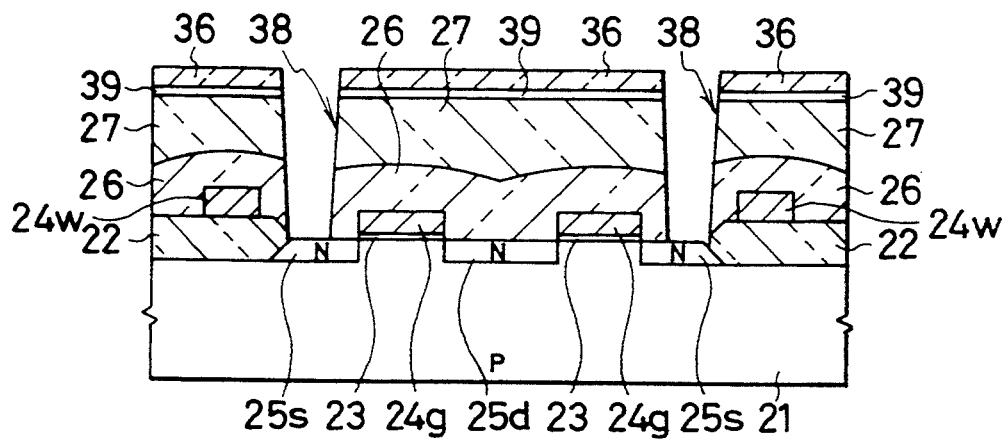
FIG. 1A through FIG. 1C are partial cross-sectional views vertical to word lines showing a fabrication sequence of a conventional semiconductor memory device, respectively.
Figure 1B:
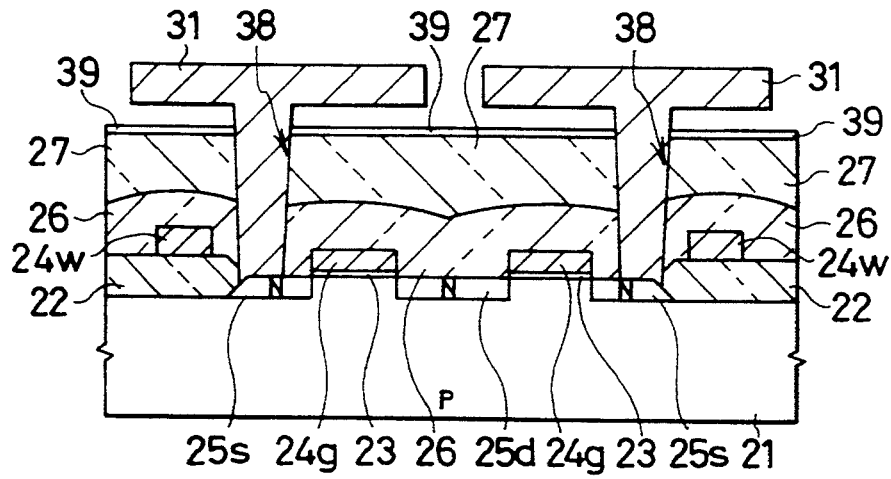
Figure 1C:
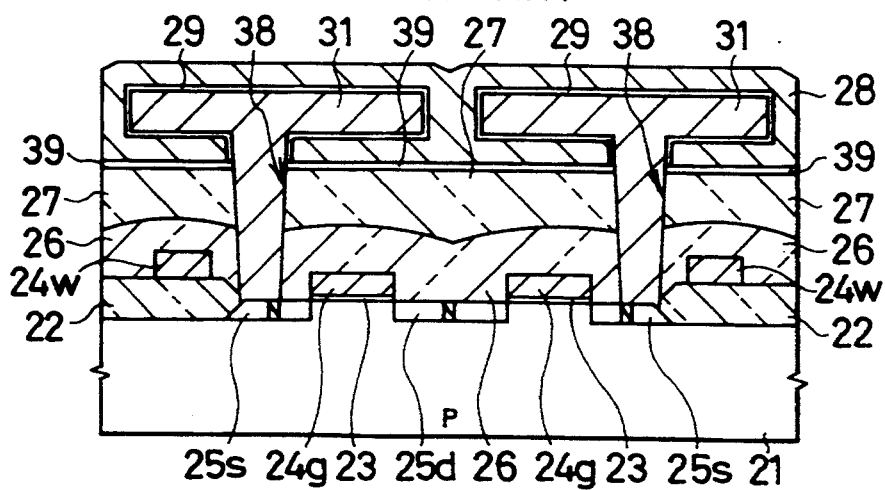
Figure 2A:
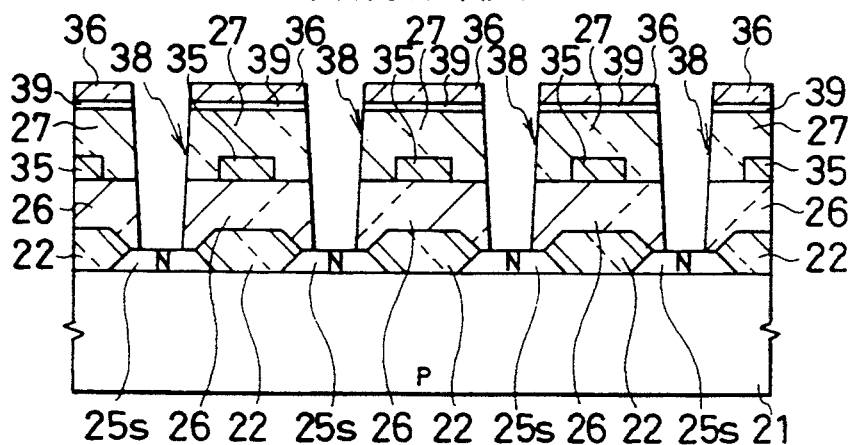
FIG. 2A through FIG. 2C are partial cross-sectional views vertical to bit lines showing the fabrication sequence of the conventional semiconductor memory device shown in FIGS. 1A through 1C, respectively..
Figure 2B:
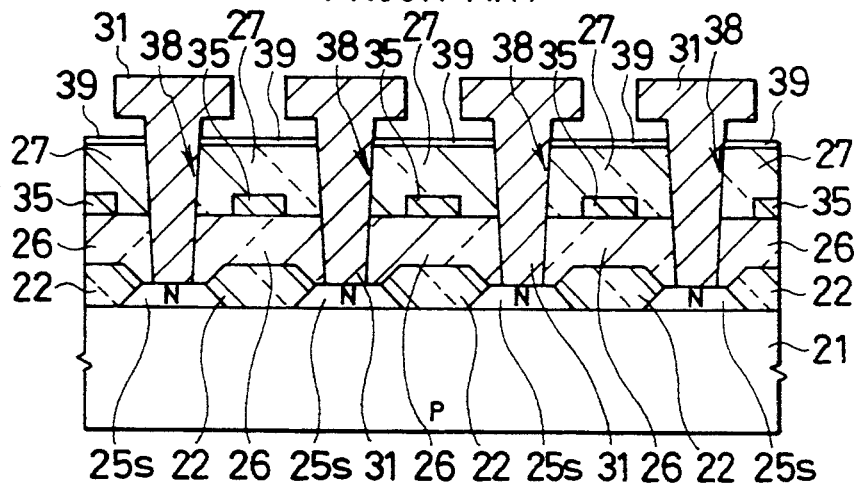
Figure 2C:
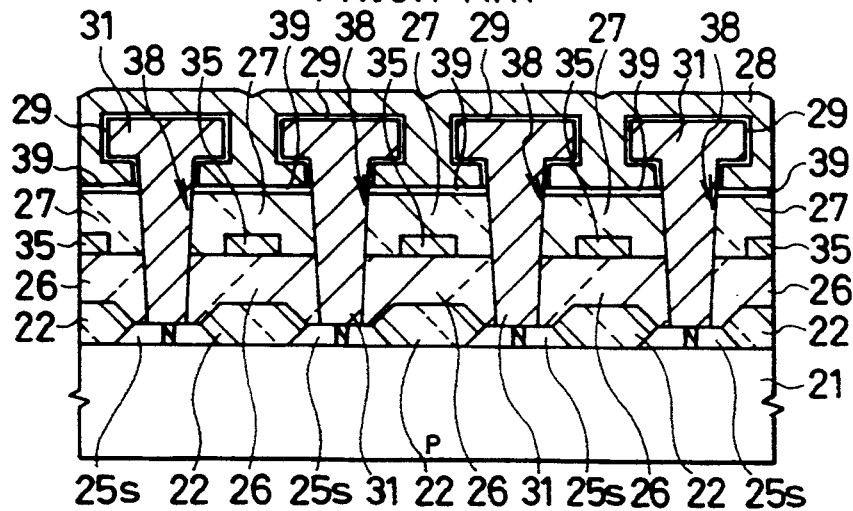
Figure 3:
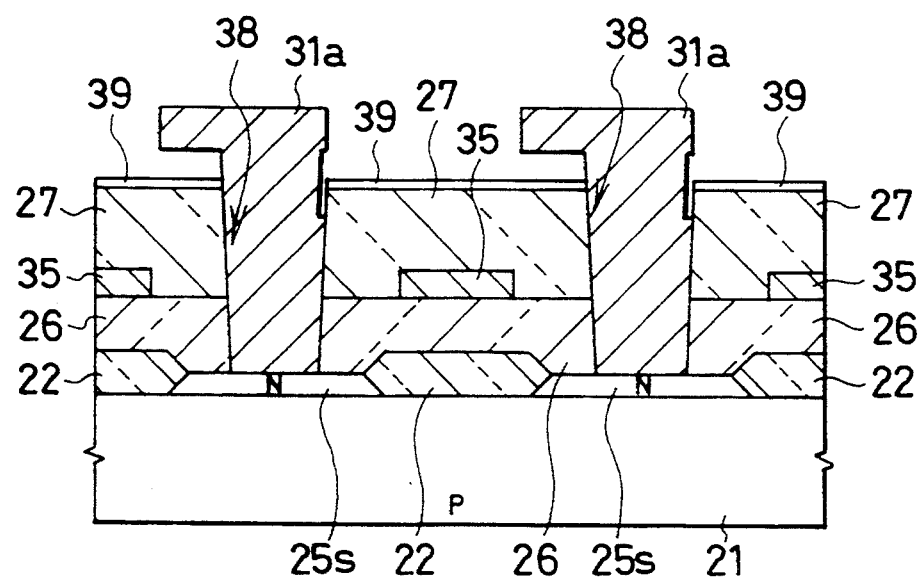
FIG. 3 is a partial cross-sectional view vertical to the word lines to explain a problem with the conventional semiconductor memory device shown in FIGS. 1A through 1C.

As seen from FIGS. 4A and 2B, the N-type diffusion layers 5s forming the source region are provided for the respective transistors and each of the N-type diffusion layers 5d forming the drain regions is provided for the two transistors adjacent to each other. The gate electrodes 4g are respectively connected to corresponding word lines 4w formed on the field oxide film 2. The gate electrodes 4g and the word lines 4w are both made of polysilicon.

The surfaces of the active areas, the gate electrodes 4g and the word lines 4w and the uncovered surface of the field oxide film 2 are covered with a first inter-layer insulation film 6. On the surface of the first inter-layer insulation film 6 bit lines 15 made of tungsten silicide are formed. A second inter-layer insulation film 7 is formed on the surfaces of the bit lines 15 and the uncovered surface of the first inter-layer insulation film 6.

A first opposed electrode 8 for the storage capacitors is formed on the second inter-layer insulation film 7. The first opposed electrode 8 is made of a polysilicon film and is commonly used by all of the transistors.

The first opposed electrode 8 has a plurality of recesses 8b arranged at equal intervals in the respective directions along the word lines 4w and the bit lines 15 on its upper face. The recesses 8b have rectangular planar shapes and whose top faces are open. Contact holes 18 are formed so that they pass through the bottom of the first opposed electrode 8 and the second inter-layer insulation film 7 to reach the surfaces of the corresponding N-type diffusion layers 5s as the source regions, respectively.

The top ends or openings of the contact holes 18 are positioned at the centers of the corresponding recesses 8b, respectively. The side faces of the first opposed electrodes 8 which face the corresponding contact holes 18 are covered with silicon oxide films 10, respectively. The other surfaces of the electrodes 8 than the side faces are covered with silicon nitride films 9, respectively. In other words, the bottom and side faces of the electrode 8 in the respective recesses 8b and top faces thereof out of the recesses 8b are covered with the silicon nitride films 9, respectively. Each of the silicon oxide films 10 and each of the silicon nitride film 9 act as a first insulation film for each capacitor.

In each of the recesses 8b a charge storage electrode 11 is provided on the silicon nitride film 9. Each electrode 11 is made of a polysilicon film. The top faces of the charge storage electrodes 11 are substantially the same in height as the top faces of the first opposed electrode 8 which are outside the recesses 8b. The bottom ends of the charge storage electrodes 11 are extending to the surfaces of the corresponding N-type diffusion layer 5s as the source regions, resulting in electrical interconnections between the charge storage electrodes 11 and the corresponding N-type diffusion layers 5s. Accordingly, each of the charge storage electrodes has a T-shape cross-section similar to that of the conventional DRAM.

Figure 8:
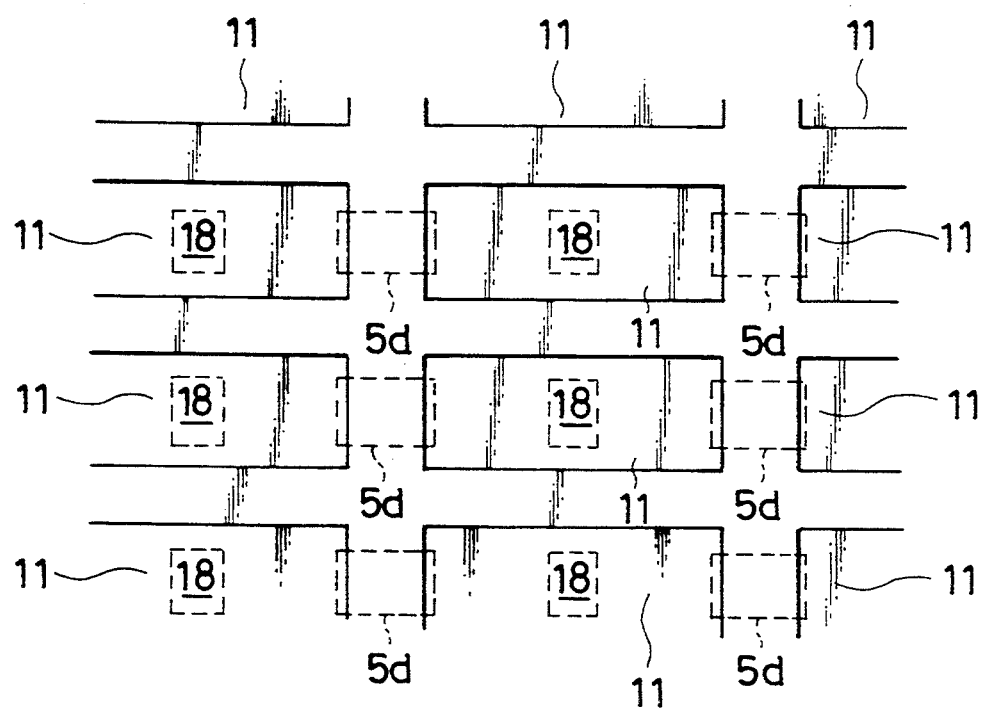
FIG. 8 is a layout diagram of the semiconductor memory devices of the first and second embodiments showing positional relationships between the MOS transistors and the charge storage electrodes of the storage capacitors.

The MOS transistors of the memory cells are arranged in a matrix pattern on the substrate 1, so that the recesses 8b of the first opposed electrodes 8 are arranged in a matrix pattern corresponding to that of the MOS transistors, as clearly shown in FIG. 8. The pattern of the recesses 8b is similar to a grid.

In FIG. 8, for the sake of simplification, there are shown only the positional relationships between the N-type diffusion layers 5d as the drain regions, the charge storage electrodes 11 and the contact holes 18.

It is seen from FIG. 8 that the N-type diffusion layers 5d and 5s and the gate electrodes 4g are respectively arranged at equal intervals in the transverse and vertical directions thereby to constitute an array of the transfer transistors. In response to the array the charge storage electrodes 11 and the contact holes 18 are also arranged at equal intervals in the transverse and vertical directions, respectively.

The surfaces of the charge storage electrodes 11 and the uncovered surfaces of the silicon nitride films 9 are covered with a second insulation film 12 made of silicon nitride. A second opposed electrode 13 for the capacitors is formed on the entirety of the second insulation film 12. The surface of the second opposed electrode 13 is covered with a third inter-layer insulation film 14.

The first opposed electrode 8, the silicon nitride film 9 and the silicon oxide film 10 as the first insulation film, the charge storage electrode 11, the second insulation film 12 and a second opposed electrode 13 constitute each of the stacked capacitor.

Figure 5A:
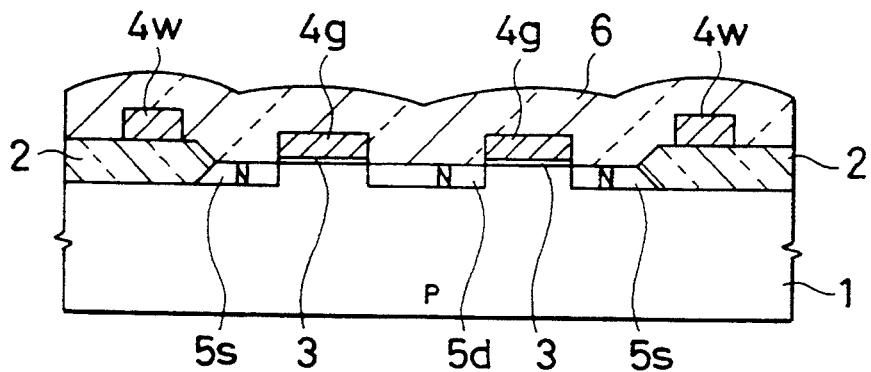
FIG. 5A through FIG. 5F are partial cross-sectional views vertical to word lines of the semiconductor memory device of the first embodiment showing its fabrication sequence, respectively.
Figure 6A:
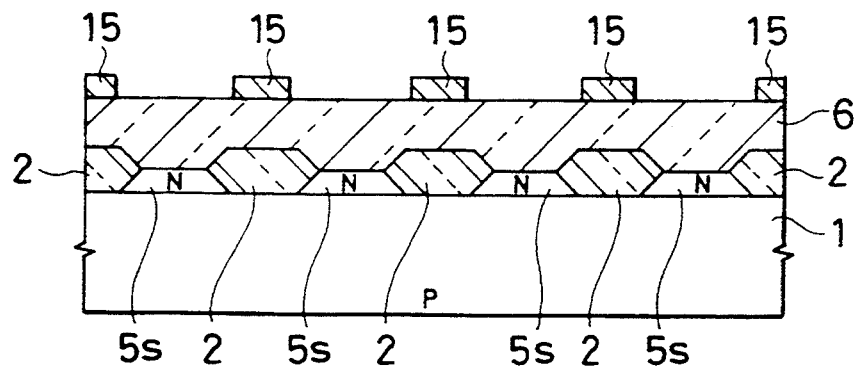
FIG. 6A through FIG. 6F are partial cross-sectional views vertical to bit lines of the semiconductor memory device of the first embodiment showing its fabrication sequence, respectively.

The DRAM cells of the first embodiment having the above structure are fabricated through the following sequence:

First, as shown in FIGS. 5A and 6A, the field oxide film 2 of about 500 nm in thickness is selectively formed on the surface of the P-type silicon substrate 1 using a conventional selective oxidation technique so that the active regions are formed on the surface of the substrate 1. The active regions of the substrate 1 are then ion-implanted for controlling the threshold voltage of the MOS transistors.

The gate oxide films of about 15 nm in thickness are grown on the respective active regions and then, a polysilicon film of about 250 nm in thickness is grown all over the substrate 21. Phosphorus (p) is diffused into the polysilicon film to reduce its sheet electric resistance to a desired level and then, the polysilicon film is etched to a desired pattern using a photolithography technique. Thus, the gate electrodes 4g and the word lines 4w are obtained.

Next, with the field oxide film 2 and the gate electrodes 4g as a mask, phosphorus (P) ions are implanted into the substrate 1 with a dose of about $10^{13}$ cm$^{-2}$ and the substrate 1 is heat-treated. This results in the N-type diffusion layers 5s and 5d to function as the source and drain regions.

A silicon oxide film and a BPSG film containing as impurities boron (B) and phosphorus (P) are successively formed over the surface of the substrate 21 using a Chemical Vapor Deposition (CVD) technique to form the first inter-layer insulation film 6 of about 350 nm in thickness. The state at this time is shown in FIGS. 5A and 6A.

Subsequently, using a photolithography technique, a wiring layer (not shown) is formed on the first inter-layer insulation film 6 to make contacts for the bit lines 5, and contact holes (not shown) for connecting the diffusion layers 5s and 5d and the gate electrodes 4g are formed in the first insulation film 6.

A tungsten silicide film of about 150 nm in thickness is formed on the first inter-layer insulation film 6 by a sputtering technique and patterned the tungsten silicide film by a photolithography technique. Thus, the bit lines 5 made of tungsten silicide are obtained.

A BPSG film of about 400 nm in thickness is formed on the entirety of the first inter-layer insulation film 6 and is reflowed to be flattened, resulting in the second inter-layer insulation film 7. A polysilicon film 8a of about 150 nm in thickness is formed on the entirety of the second inter-layer insulation film 7.

Figure 5B:
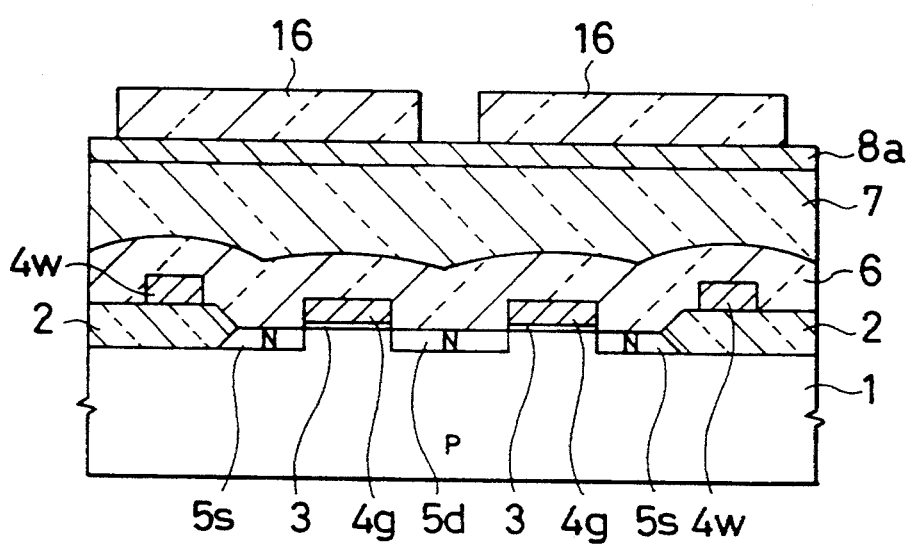
Figure 6B:
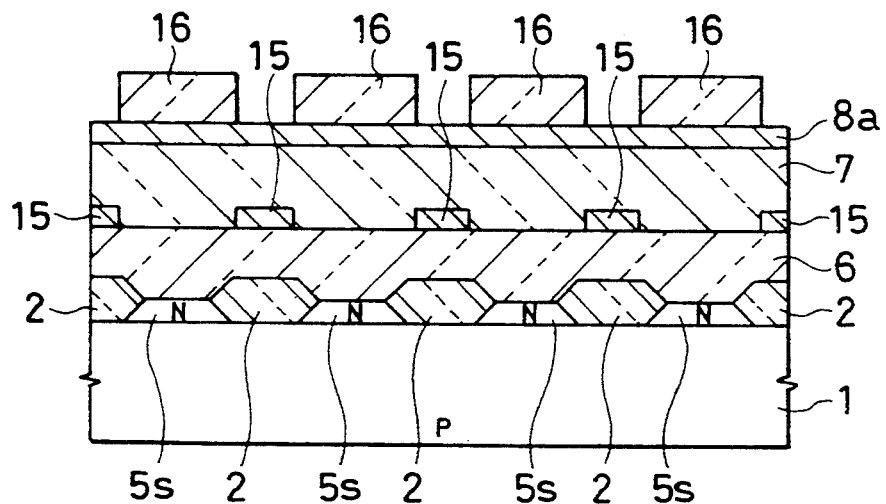

A silicon oxide film 16 of about 350 nm in thickness is grown on the entirety of the polysilicon film 8a. Using a photolithography technique, the silicone oxide film 16 is etched to a pattern corresponding to the layout pattern of the recesses 8b of the first opposed electrode 8 (or the charge storage electrodes 11). The state at this time is shown in FIG. 5B and 6B. Thus, a plurality of unetched parts of rectangular planar shape are arranged on the polysilicon film 8a at regular intervals.

Figure 5C:
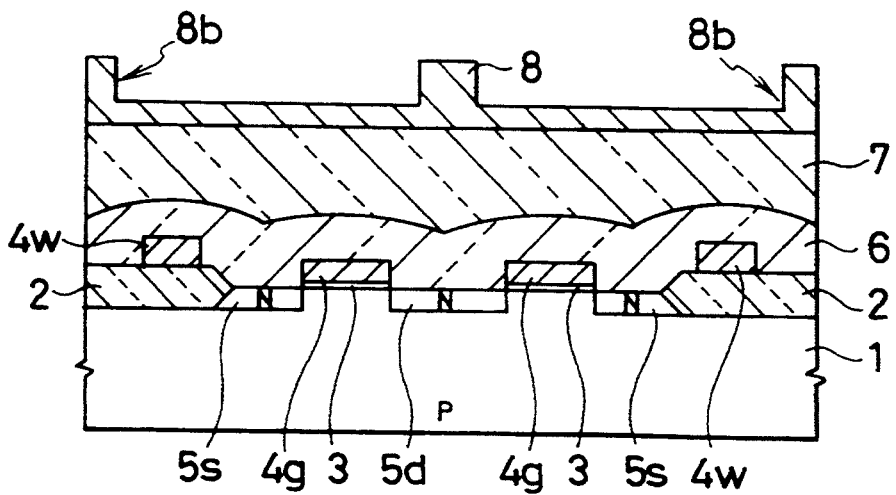
Figure 6C:
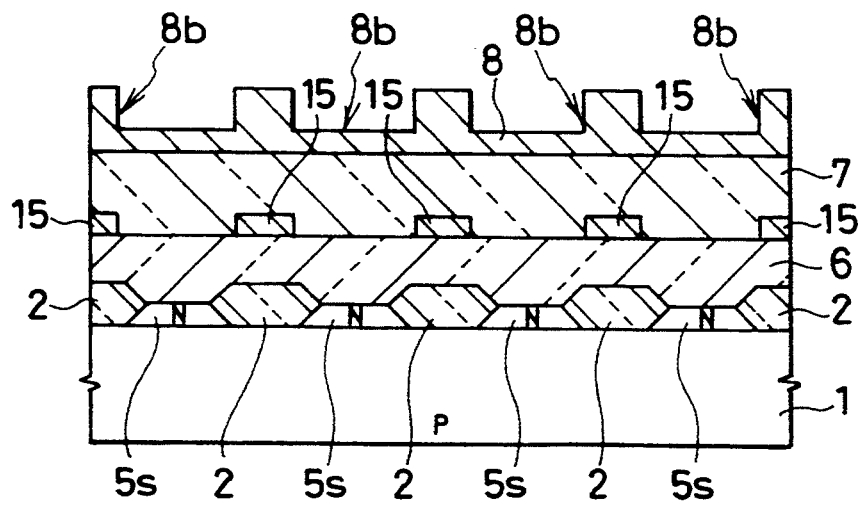

Next, a polysilicon film of about 400 nm in thickness is grown on the entirety of the polysilicon film 8a so as to cover the unetched parts of the silicon oxide film 16 and is etched back. Thus, the polysilicon film remains to fill up the gaps between the unetched parts of the film 16. The unetched parts is then removed by etching using buffered hydrogen fluoride and phosphorus is diffused into the polysilicon film to reduce its sheet electric resistance to a desired level. Thus, a first opposed electrode 8 having a plurality of the recesses 8b and made of polysilicon is obtained, as shown in FIGS. 5C and 6C.

Figure 5D:
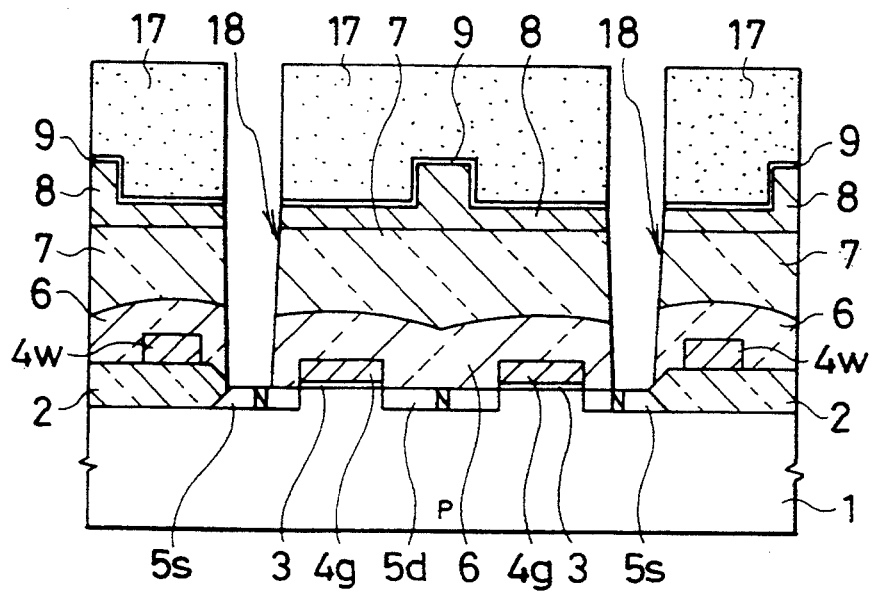
Figure 6D:
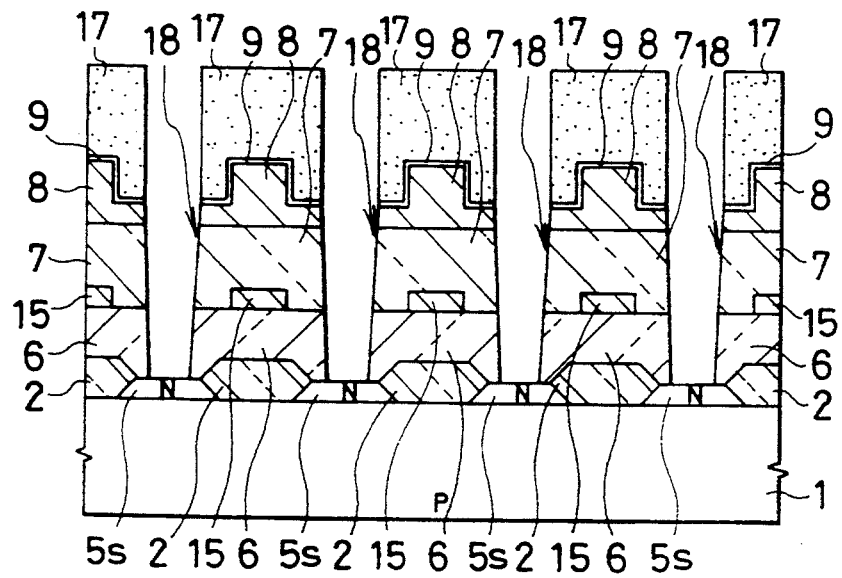

The silicon nitride film 9 of about 7 nm in thickness is grown on the entire surface of the first opposed electrode 8. A photoresist film 17 is formed on the silicon nitride film 9 and is patterned to have holes at positions corresponding to the respective contact holes 18. Using the patterned photoresist film 17, the silicon nitride film 9, the first opposed electrode 8, the second inter-layer insulation film 7 and the first inter-layer insulation film 6 are etched to obtain the contact holes 18. The state at this time is shown in FIGS. 5D and 6D.

After removing the photoresist film 17, heat-treatment is carried out in a steaming atmosphere, so that silicon oxide films are grown on the side faces of the first opposed electrode each of which faces the respective contact holes 18 and on the surfaces of the N-type diffusion layers 5s made of single-crystal silicon, respectively.

Figure 5E:
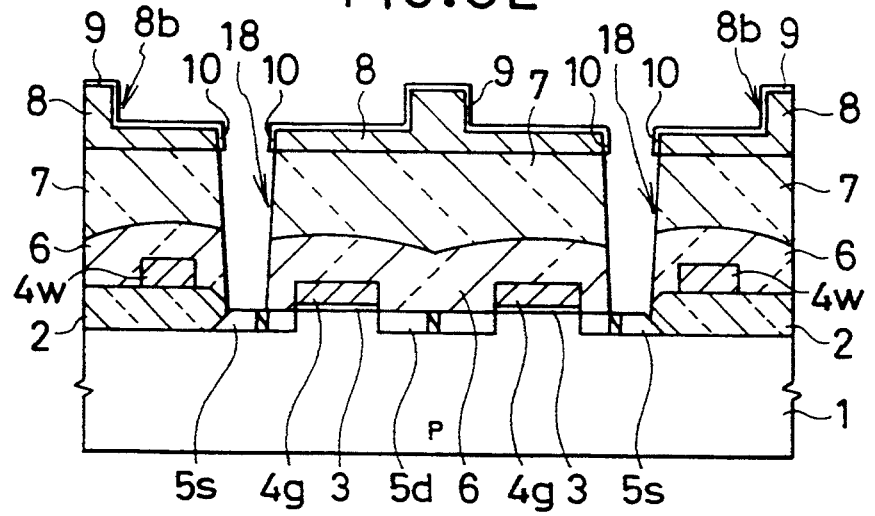
Figure 6E:
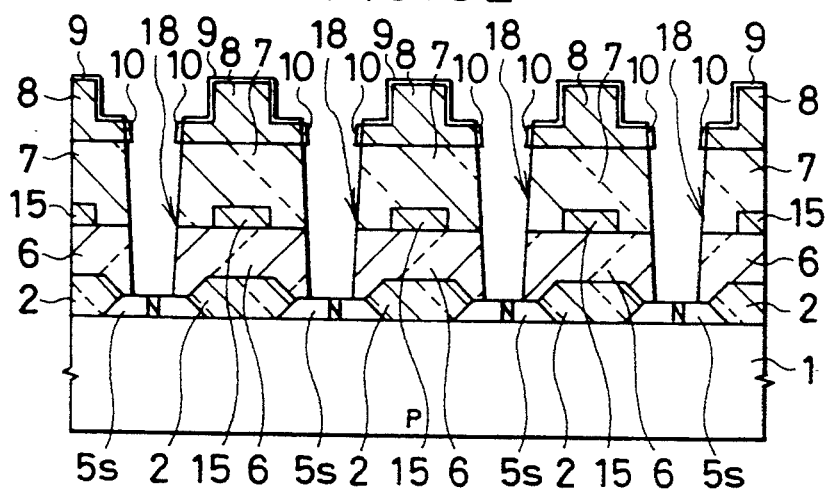

Since polysilicon is larger in oxidation rate than single-crystal silicon in general, the silicon oxide films grown on the side faces of the first opposed electrode 8 become larger in thickness than those on the diffusion layers 5s. Therefore, the silicon oxide films on both of the electrode 8 and diffusion layers 5s are etched until only the silicon dioxide films on the diffusion layers 5s are entirely removed. Unetched parts of the silicon dioxide films remain on the side faces of the first opposed electrode 8, respectively, as shown in FIGS. 5E and 6E. Thus, the silicon dioxide films 10 are obtained so that they are connected to the corresponding silicon nitride films 9, resulting in electrical insulation of the entire surface of the first opposed electrode 8.

Figure 5F:
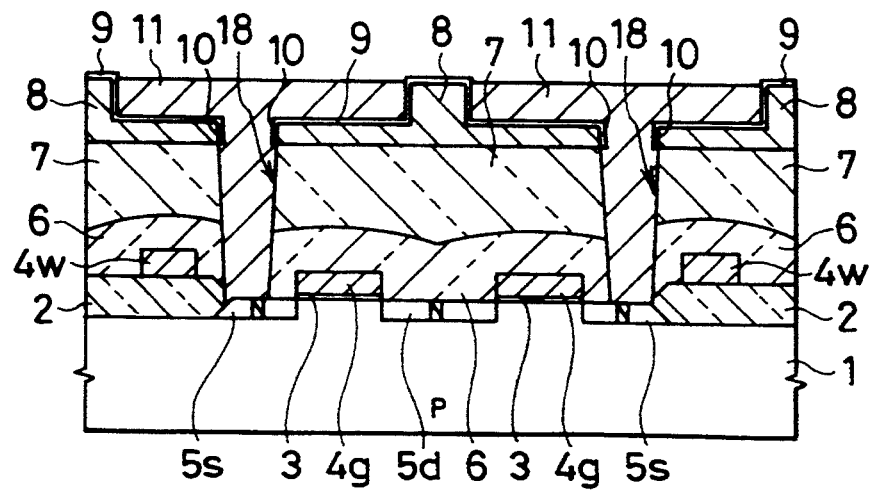
Figure 6F:
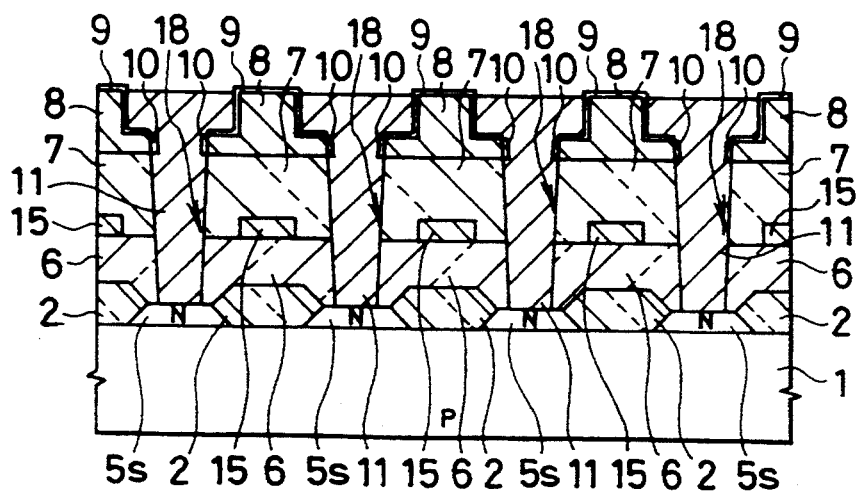

Next, a polysilicon film of about 600 nm in thickness is grown on the silicon nitride film 9 all over the substrate 1 and is etched back until the silicon nitride film 9 becomes partially exposed from the polysilicon film outside the recesses 8b. Thus, as shown in FIGS. 5F and 6F, the charge storage electrodes 11 which are made of polysilicon and have substantially T-shape cross sections can be obtained. These electrodes 11 are formed so as to be buried into the respective recesses 8b and the respective contact holes 18. The bottom ends of the electrodes 11 are in contact with the N-type diffusion layers 5s.

Wing-like upper parts of the charge storage electrodes 11 provided in the corresponding recesses 11 are supported by both of columnar lower parts thereof provided in the corresponding contact holes 18 and the first opposed electrodes 8, so that the charge storage electrodes 11 are difficult to be broken due to mechanical shocks occurring in centrifugal drying, vacuum drawing or the like during the fabrication sequence of the DRAM.

Subsequently, a silicon nitride film of about 7 nm in thickness is grown on the surfaces of the charge storage electrodes 11 and uncovered surface of the silicon nitride film 9 all over the substrate 1 and is heat-treated under the steaming atmosphere, resulting in the second insulation film 12 made of silicon nitride film.

A polysilicon film of about 150 nm in thickness is grown on the entire surface of the second insulation film 12 and sheet electric resistance of the polysilicon film is reduced to a desired level by phosphorus diffusion. The polysilicon film is then patterned to form the second opposed electrode 13 for the capacitors.

A third inter-layer insulation film 14 is formed on the entire surface of the second opposed electrode 13.

As described above, the stacked-capacitor type memory cells of the DRAM as shown in FIGS. 4A and 4B are obtained.

In the DRAM memory cells having the above structure, each of the storage capacitors can have a large capacitance with a small cell size similar to the conventional one with the FIN-structure as well as there is no possibility that the charge storage electrodes 11 are broken during the fabrication sequence thereof.

Moreover, the surface of the second inter-layer insulation film 7 is covered with the first opposed electrode 8 and the contact holes 18 are respectively provided to extend through the first opposed electrode 8. Therefore, even if the charge storage electrodes 11 are sheered off in centering or positioning to the corresponding contact holes 18 during the fabrication sequence, there is no possibility that the second inter-layer insulation film 7 is disadvantageously etched. Since the charge storage electrodes 11 are provided in the respective recesses 8b of the first opposed electrode 8, the shapes of the charge storage electrodes 11 can be made into desired ones due to the above sheering-off.

In addition, no stacked structure of a silicon nitride film and a silicon oxide film is provided during the fabrication sequence different from that of the conventional one, so that there is no possibility that coverage of a metallic wiring layer formed over the storage capacitors through another inter-layer insulation film such as the third inter-layer insulation film 14 is adversely affected due to projection of the silicon nitride film during the process of forming the contact holes 18 and/or that of pre-treatment for the metallic wiring layer.

Accordingly, by the fabrication method of the embodiment, the stacked capacitor-type DRAMs can be fabricated at a high fabrication yield and DRAMS fabricated by the method are small in variation of their electrical characteristics.

[Second Embodiment]

Figure 7A:
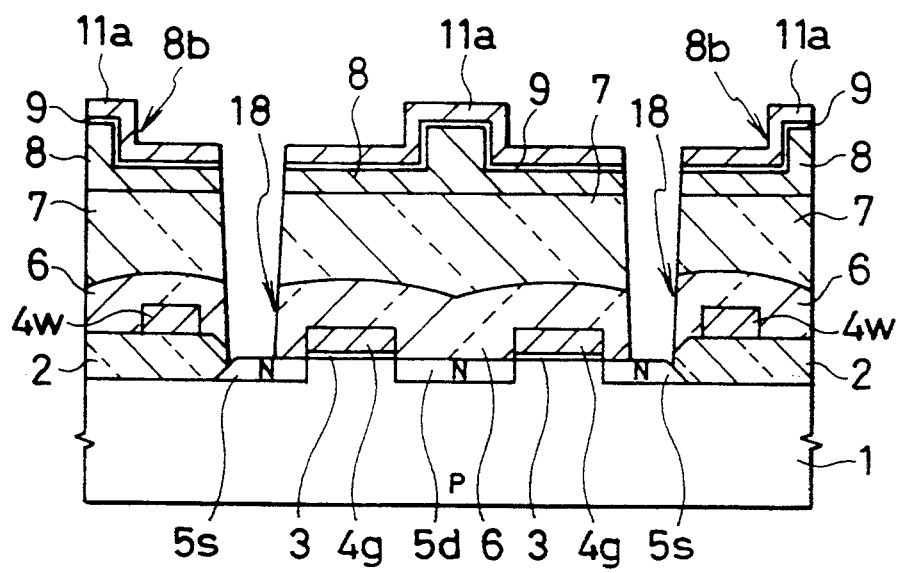
FIG. 7A and FIG. 7B are partial cross-sectional views vertical to word lines of a semiconductor memory device of a second embodiment of the present invention showing its fabrication sequence, respectively.
Figure 7B:
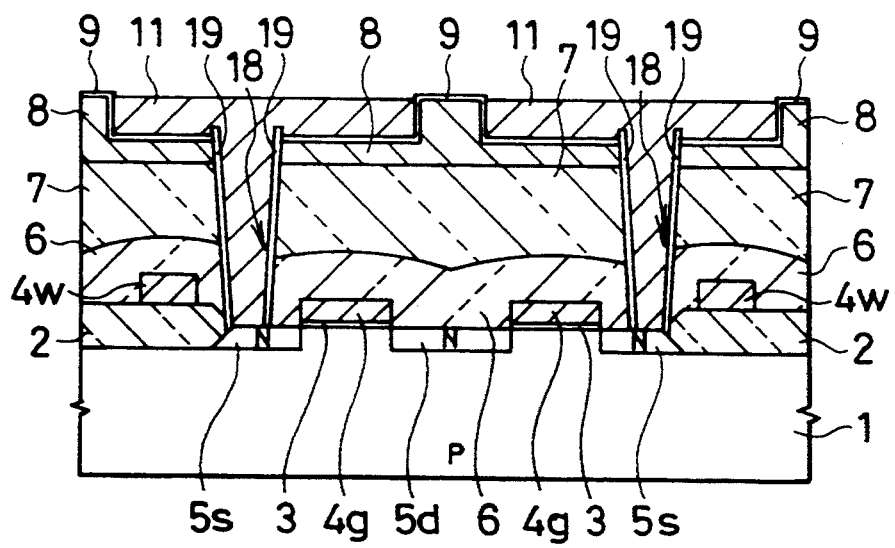

FIGS. 7A and 7B shows DRAM memory cells according to a second embodiment of the present invention. In the figures, the same reference numbers as those in the first embodiment are attached to corresponding elements.

The memory cells of the second embodiment have substantially the same configuration as those of the first embodiment other than that silicon oxide films 19 are provided not only on the respective side faces of the first opposed electrode 8 but also on the entire inner faces of the respective contact holes 18, as shown in FIG. 7B.

First, the first opposed electrode 8 is provided through the same processes as those of the first embodiment as shown in FIG. 5A through FIG. 5C and FIG. 6A through FIG. 6C. Then, a silicone nitride film of about 7 nm in thickness is grown on the entire surface of the silicon nitride film and is heat-treated in a steaming atmosphere to grow a silicon oxide film of about 1 to 2 nm in thickness thereon. The silicon nitride film and silicon oxide film constitute the first insulation film 9.

Next, a polysilicon film 11a of about 100 nm in thickness is grown on the first insulation film 9. The state at this time is shown in FIG. 7A.

Using a photolithography technique, the polysilicon film 11a, the first insulation film 9, the first opposed electrode 8, the second inter-layer insulation film 7 and the first inter-layer insulation film 6 are etched to form the contact holes 18 extending to the surfaces of the respective N-type diffusion layers 5s.

A silicon oxide film of about 100 nm in thickness is grown on the surface of the polysilicon film 11a using a Low-Pressure Chemical Vapor Deposition (LPCVD) technique. The entirety of the silicon oxide film is etched back so that parts of the silicon oxide film remain on the inner side faces of the contact holes 18, resulting in the silicon oxide film 19 formed of unetched parts thereof.

Subsequently, the charge storage electrodes 11, the second insulation film 12, the second opposed electrode 13 and the third inter-layer insulation film 14 are successively formed through the same processes as those in the first embodiment. Thus, the DRAM cells having the stacked-capacitor structure of the second embodiment are given.

In the second embodiment, the same effects or advantages as those in the first embodiment can be obtained. In addition, since the contact holes 18 are made while the first insulation films 9 are covered with the polysilicon film 11a in the process shown in FIG. 7A, there is an additional advantage that there is no possibility of damage of the first insulation films in this process.

In the DRAMs of the first and second embodiments, the first opposed electrode 8 and the second opposed electrode 13 can be made equal in electric potential to each other by connecting them with an aluminum film outside the memory cell array region. The first and second opposed electrodes 8 and 13 are preferably used in this potential condition, however, they may be used in a condition whose electric potential are different from each other.

What is claimed is:

1. A fabrication method of a semiconductor memory device having stacked-capacitor memory cells each of which includes an MOS transistor and a storage capacitor, said method comprising the steps of:

forming source regions and drain regions of said MOS transistors of said memory cells in a semiconductor substrate;

forming gate electrodes of said transistors through corresponding gate insulators on said substrate;

forming an inter-layer insulation film to cover said source and drain regions and said gate electrodes;

forming a first opposed electrode for said storage capacitor on said inter-layer insulation film, said first opposed electrode having recesses on its upper face;

forming a first insulation film for said capacitor to cover a surface of said first opposed electrode;

forming contact holes extending to said corresponding source regions in said inter-layer insulation film;

forming charge storage electrodes for said respective capacitor in the respective recesses of said first opposed electrode to be in contact with said corresponding source regions through said corresponding contact holes;

forming a second insulation film for said capacitor to cover surfaces of said respective charge storage electrodes; and forming a second opposed electrode for said capacitor on said second insulation film.

2. A fabrication method of a semiconductor memory device according to claim 1, further comprising a step of forming a film for protecting said first insulation film on said first insulation film between said step of forming a first insulation film and said step of forming said contact holes.

* * * * *